United States Patent [19]

Del Bianco

[11] 4,214,936
[45] Jul. 29, 1980

[54] LAMINATION PROCESS

[75] Inventor: Matthew A. Del Bianco, Audubon, N.J.

[73] Assignee: E. I. Du Pont de Nemours and Company, Wilmington, Del.

[21] Appl. No.: 954,086

[22] Filed: Oct. 24, 1978

[51] Int. Cl.² ............... B32B 31/20; B32B 31/10; C23F 1/02

[52] U.S. Cl. ............... 156/302; 156/351; 156/358; 156/359; 156/361; 156/366; 156/630; 156/634; 156/656; 156/659.1; 156/902; 430/319; 430/523

[58] Field of Search ............ 156/299, 300, 301, 302, 156/351, 358, 359, 366, 362–364, 361, 345, 629–630, 633–634, 659, 661, 655, 656, 901, 902, 499, 552; 96/35.1, 36.2, 86 R, 86 P, 87 R; 29/625

[56] References Cited

U.S. PATENT DOCUMENTS

| | | | |
|---|---|---|---|
| 3,218,167 | 11/1965 | Burg et al. | 96/35.1 |
| 3,469,982 | 9/1969 | Celeste | 96/36.3 X |
| 3,547,730 | 12/1970 | Cohen et al. | 96/35.1 X |
| 3,623,933 | 11/1971 | Staats | 156/552 |
| 3,754,557 | 8/1973 | Moore | 285/177 X |
| 4,025,380 | 5/1977 | Bernardo | 156/555 X |

*Primary Examiner*—William A. Powell
*Assistant Examiner*—Thomas Bokan

[57] ABSTRACT

A process for laminating thermoplastic film such as photosensitive film to a panel by continuous advancement and contact preheating of the panel to a lamination step which is discontinuous, being actuated according to position of the panel, to thereby uniformly space the resultant laminates from each other.

9 Claims, 2 Drawing Figures

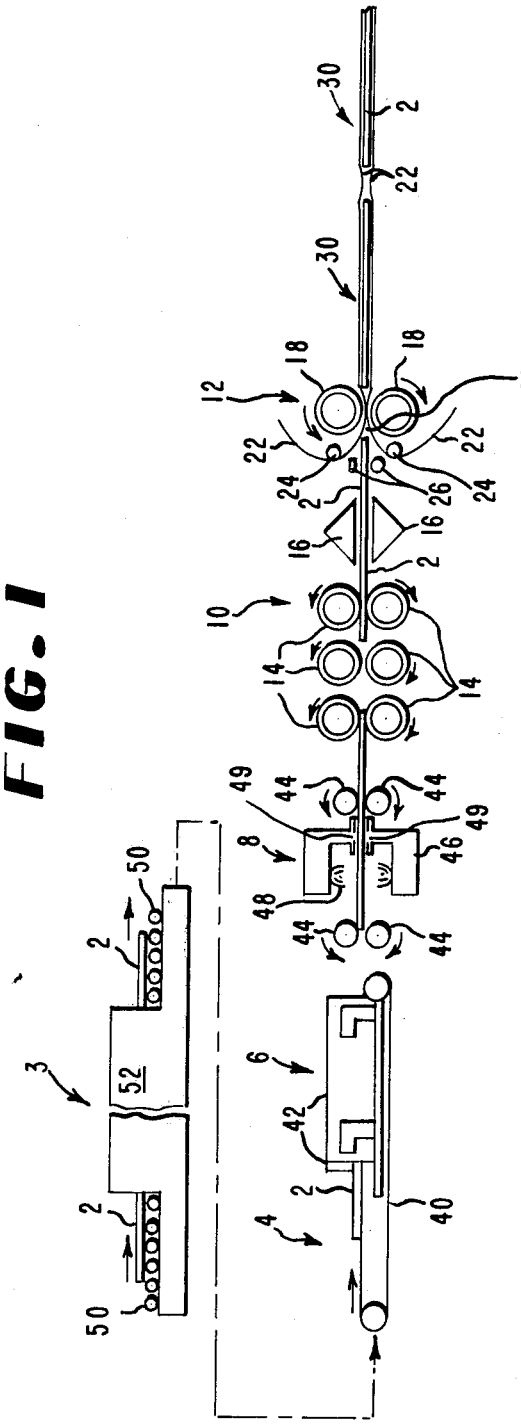
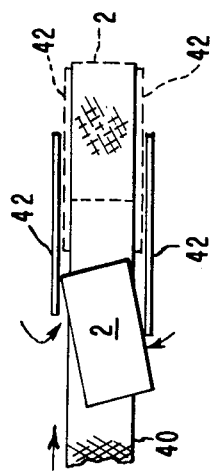

LAMINATION PROCESS

TECHNICAL FIELD TO WHICH THE INVENTION RELATES

This invention relates to the lamination of a polymeric film to an element and more particularly to a succession of elements wherein the lamination also uniformly spaces the resultant laminates from each other.

BACKGROUND ART

U.S. Pat. No. 3,623,933 discloses an apparatus, the operation of which involves conveying a sheet product to the nip between a pair of laminating rolls, the driving roll of which continuously rotates at a speed which can be greater than the conveyor speed. A film is supplied to the nip, and when the sheet product reaches the nip, the rotating roll grips it and the film to advance them through the nip, thereby laminating the film to the product. The apparatus and process makes no provision for heating the sheet product except by heating the laminating rolls, which then heat the sheet product through the film being laminated. A disadvantage of this apparatus and its process is when heating of the sheet product is necessary to obtain adhesion of the film to the sheet product, slow passage of the sheet product through the nip would be required for sufficient heating of the sheet product, and this slow passage may lead to undesired softening and uneven flow of the film being laminated to the sheet product.

A process is also known for laminating a photosensitive film to a printed circuit board to serve as a resist in the manufacture of a printed circuit, such as described in U.S. Pat. No. 3,469,982. Such process has involved introducing the board and photosensitive film together to the nip of a pair of heated laminating rolls, which rotate to laminate the film to the board. Rotation of the laminating rolls has been actuated by a microswitch sensing the board upstream of the nip and stopped when the board passed the switch and through the nip. This process suffered from the same disadvantage as in U.S. Pat. No. 3,623,933. In addition, the process usually involved manual feeding of the circuit boards to the laminator, which was more expensive than desired and reduced yield.

U.S. Pat. No. 3,547,730 discloses an apparatus and process in which heated laminating rolls continuously operate to laminate photosensitive film to printed circuit board fed from a supply bin containing such boards. This patent also discloses that film and or board can be fed through a preheater before being fed to the laminator, but specific apparatus and process for carrying out this preheating is not disclosed. In industry, it has been customary to do preheating by radiant heating of the circuit board such as in an oven. Often this preheating was done on a batch of circuit boards which were then successively fed to the lamination step, this operation suffering from the disadvantage of manual handling as well as temperature variation from board to board during the lamination process. U.S. Pat. No. 4,025,380 discloses conveying circuit boards through a radiant heater (Infrared-heater lamps) and then to lamination which involves stopping the movement of the board while a severed edge of the film is adhered to the leading edge of the board, and then the film and board are passed through laminating rolls to laminate the remainder of the film to the board, with the film being severed to match the trailing edge of the board prior to passing through the laminating rolls. This process suffers from the disadvantage of the two-step lamination process being complicated and the radiant preheating being inefficient and so remote from the lamination that excessive heat loss occurs. In addition, the process makes no provision for establishing alignment of the boards fed to the process unless supplied from a stack of boards or for maintaining the established alignment.

The need has arisen for greater economies in lamination, e.g., faster laminating speeds, less manual operations, greater yield, and reduced film waste which are not satisfied entirely by prior laminating techniques.

SUMMARY OF THE INVENTION AND ITS ADVANTAGES

The present invention satisfies the aforesaid need by the process of laminating a thermoplastic polymeric film to a succession of elements in which the resultant laminates are uniformly spaced from one another in accordance with the following steps:

(a) the succession of elements is sequentially gripped between continuously moving surfaces at least one of which is heated to preheat and continuously advance the succession of elements to the nip formed between converging surfaces, at least one of which is heated, (b) a continuous length of thermoplastic polymeric film is supplied to the upstream side of the nip to be heated by the converging surfaces at the nip, (c) the converging surfaces are caused to move in response to the presence of the first preheated element of the succession of elements immediately upstream of the nip, to grip and advance the preheated element and heated film together through the nip to laminate the film to the element, the moving of the converging surfaces being at a greater speed than the speed of advancement of the continuously moving surfaces, (d) the movement of the converging surfaces is stopped after the resulting laminate passes through said nip and, (e) steps (b), (c), and (d) are repeated on the remaining elements of the succession of elements.

To explain the advantages of this process, first it automatically processes a succession of elements without any manual handling in either the element-preheating step or the laminating step or between these steps. This represents a savings in labor cost as well as an improvement in yield because of the reduced manual handling. Second, when preheating is necessary for obtaining adhesion of the film to the element, as in the present process, the requirement for preheating becomes more difficult to satisfy as the process is speeded up. The use of contact heating of the elements provides faster heat-up of the surface of the elements, which enables the lamination step to be speeded up, to bring about increased productivity. Finally, control of the movement of the converging surfaces, i.e., stopping and starting, by sensing the different positions of the element (including its laminate with film), automatically uniformly spaces the laminates from each other. In addition, this spacing can be a close spacing, e.g., as little as about 12.5 mm from laminate to laminate, whereby the amount of film interconnecting laminates is small, to bring about a savings in the use of film.

It will be noted that the converging surfaces for lamination move discontinuously, while the heated moving surfaces for preheating move continuously. Discontinuous movement of the converging surfaces is necessary to get uniform spacing of the resultant laminates. Jam-up of the elements upstream of the nip is avoided by the faster movement of the converging surfaces than the speed of advancement of the elements to the nip by the heated moving surfaces.

BRIEF DESCRIPTION OF DRAWINGS

FIG. 1 shows in schematic side elevation apparatus for carrying one embodiment of the process of the present invention.

FIG. 2 shows in schematic plan view operation of the alignment step of the process.

DETAILED DESCRIPTION AND BEST MODE CONTEMPLATED

The apparatus shown in the drawing depicts a series of operations (steps) being performed on a succession of elements 2, namely cleaning 3, conveying 4 through aligning 6, vacuum cleaning 8, preheating 10, and laminating 12.

The focus of the present invention is the heating and laminating steps 10 and 12, respectively. The succession of elements 2 can be fed to the preheating step 10 manually but is preferably fed automatically from a preceding operation such as the vacuum cleaning step 8 shown in the drawing. The elements are sufficiently clean that the polymeric film to be laminated to them will adhere to elements.

Apparatus for performing the preheating of the elements 2 as shown in FIG. 1 comprises a series of rubber-covered rolls 14 arranged above and below the path of the succession of elements and biased toward one another so as to sequentially grip the faces of each element as it is fed to the preheating step. The rolls are heated and extend entirely across each face of each element so as to preheat each face for subsequent lamination of film to both faces of each element. The rolls 14 are driven to continuously rotate in the direction shown so as to advance each element to the laminating step. Generally, the rolls are heated to a temperature of at least 80° C.; the temperature used will depend on the temperature desired for the element and the contact time of the rolls with the element. The contact heating used in the present process has the advantage over radiant heating used heretofore in heating essentially only the faces of the element and heating them quickly.

The rolls 14 constitute one embodiment of the continuously moving surfaces of step (a) of the process of the present invention. The rolls 14 instead of forming a nip between pairs thereof as shown in the drawing can be staggered from above and below each element so long as sufficient gripping occurs to advance the elements to the lamination step. Instead of rolls contacting and heating the faces of the elements, heated belts trained over one or more of the rolls above or below the element could accomplish this task.

A fume exhaust 16 is provided in case the lamination step causes volatiles to be formed.

Apparatus for performing the lamination step consists of a pair of heated rubber-covered rolls 18 which are rotatable in the direction shown and are biased towards one another to form a nip 20. Rolls 18 are one embodiment of the heated converging surfaces of the process of this present invention. The preheated elements 2 from the preheating step are successively advanced by rolls 14 to nip 20. A continuous length of thermoplastic polymeric film 22 is supplied to the nip 20 from rolls (not shown) above and below the path of the elements 2 via guide rolls 24 which maintain the film out of contact with the rolls 18 until the film reaches the nip. The biasing force of the rolls towards the nip supplies sufficient pressure to cause the heated film 22 to adhere to the heated element 2 when the rolls 18 rotate. The preheating temperature and temperature of rolls 18 and pressure applied at nip 20 are all adjusted to give the desired adhesion result between film and element at the particular speed used. The rolls 18 are generally heated to a temperature of at least 80° C. and their speed of rotation is preferably at least 150 cm/min.

Rotation of the rolls 18 is controlled by a conventional photoelectric sensor 26 positioned immediately upstream of nip 20 which senses the leading edge of the preheated elemment 2 advancing from the preheating step. This is the first sensing position of the element. Prior to this sensing, the rolls 18 are standing still. In response to this sensing, the sensor closes the electrical circuit between the power supply and the motor (not shown) which operates the rolls 18 and the rolls rotate in the direction shown to grip and advance the film 20 and element 2 together through nip 20 to form laminate 30 of the film to both sides of the element as shown in FIG. 1. An adjustable time delay is provided with the sensor 26 to permit the leading edge of the element to approach closer to the nip 20 then the location of sensor 26 before the rolls 18 start rotation.

Sensor 26 also senses the trailing edge of preheated element, which is the second sensing position of the element, and upon doing so opens the electrical circuit operating the rolls 18 to cause the rolls to stop rotating after a suitable time delay to permit the trailing edge of the element, i.e., the resultant laminate 30, to pass through nip 20.

This sensing of the leading edge of an element 2 upstream of the nip 20 to start rotation of rolls 18 and of the trailing edge of the element also upstream of nip 20 to stop such rotation is repeated for each preheated element 2 of the succession of elements to obtain uniform spacing from laminate to laminate downstream of the nip. This uniform spacing results from the advancement of laminate 30 stopping at a predetermined place downstream of nip 20, as a result of the sensing of the element trailing edge by sensor 26, and the lamination beginning in response to the sensing of the leading edge of the next succeeding element 2 by sensor 26 at a predetermined place upstream of nip 20.

While rolls 18 are not rotating, the short length of film 22 in contact with the rolls at nip 20 becomes overheated. This short length is not laminated to the next succeeding element but instead serves as the interconnection between laminates 30. To keep this interconnecting length of film 22 as short as possible, so as to minimize film waste, the sensor 26 can be positioned sufficiently far upstream of nip 20 that it is accessible and away from the heat of rolls 18 and the time delay delays the start of rotation of rolls 18 until an element 2 advances closer to the nip. Similarly, the time delay occurring after sensor 26 senses the trailing edge of the element can be adjusted so that rotation of the rolls 18 stops just as the resultant laminate passes through the nip. The spacing between laminates 30 shown in FIG. 1 is exaggerated for purpose of clarity.

The uniform spacing between laminates 30 and their interconnection by film 22 can be useful as a feed for further automatic processing such as photoexposure. Alternatively, the stopping of advancement of laminate 30 upon the stopping of rotation of rolls 18 can be a convenient time for trimming polymeric film 22 along the leading and trailing edges of the element 2 of within the laminate.

Driving of rolls 14 and 18 can be done by conventional means. It is important, however, that the surface speed of rolls 18 be greater than the surface speed of rolls 14. This causes the element 2 to advance more rapidly through the lamination step than the preheating step, to prevent a jam-up of elements that would otherwise occur because of the continuous advancement provided by the rolls 14 and the discontinuous operation of rolls 18.

The heating of rolls 14 and 18 is preferably accomplished by internal heating elements. The nip 20 is normally closed when nothing is present between rolls 18; film 22 and elements 2 force the nip open to accommodate these materials. Instead of a photoelectric sensor 26, other types of detection devices for sensing of the presence of element 2 and laminate 30, respectively, can be used, such as mechanical switches. A separate detection device can be used downstream of nip 20 to sense the presence of the resultant laminate and stop the rotation of rolls 18. Control of the movement of rolls 18 by such detection devices can be done by conventional means.

Where single side lamination only is carried out, the rolls 14 and 18 on the opposite side of the face of the element being laminated need not be heated.

With respect to operations on elements 2 prior to the heating step 10, the more steps that can be integrated with heating and laminating, the more economies will result. In the embodiment shown in FIG. 1, an operator places abrasive-cleaned, washed, and dried elements 2 onto a conveyor 40 which moves in the direction shown at the same speed as rolls 14. The conveyer conveys the succession of elements through an alignment device, which in the embodiment shown consists of a pair of pads 42, one on each side of conveyer 40, which reciprocate to and away from the conveyer and travel for a short distance with the conveyers to contact the side edges of the elements to straighten and align the elements 2 during conveying on conveyer 40. This alignment device is the same as is often used to alignment stacks of newspapers.

FIG. 2 shows how the alignment is achieved. Specifically, the element 2 may have been placed on the conveyer 40 in a skewed disposition as shown in FIG. 2. Pads 42 move towards the element and in the same direction as the element and along the path of movement of the element but at a faster speed so as to straighten the element and align it as shown in phantom lines, without the skewed element "hanging-up" on the pads 42 as could occur if fixed alignment rails were used.

The aligned elements are then successively gripped and advanced through a vacuum cleaning step 8 by driven rolls 44 on both sides of a vacuum chamber 46 which has a slot 49 opening against both faces of the elements 2 as they pass therethrough. The surface speed of rolls 44 is the same as rolls 14.

Included in the vacuum cleaning step can be a static eliminator 48 which operates to neutralize all electrical charges on both faces of each element 2 to permit any particles on the faces to be vacuumed away and to prevent the element from attracting new air- or machine-borne particles prior to the lamination step 18. The apparatus from the static eliminator to preheating and even lamination may be positioned in a housing (not shown) to retain the clean faces of the elements up to the time of lamination.

At all times after alignment of an element 2 in the alignment step 6, the element is gripped by at least one pair of rollers and preferably at least two pairs of rollers which also advance the element towards lamination. This gripping automatically retains this alignment, which can correspond to the edges of film 22 supplied to nip 20, and permits the width of film 22 to be selected so that there is no edgewise waste of the film. In order for laminating rolls 18 and one or more pairs of rolls 14 to simultaneously grip a single element 2 to maintain alignment right up to the lamination step, an override clutch is provided in the drive for the rolls 14 to permit the fasterspeed rolls 18 to pull the element through the rolls 14 at a faster speed than the rolls 14 would otherwise convey the element.

Preferably, the cleaning step is integrated with the apparatus so as to save manual handling between cleaning and conveying for alignment. FIG. 1 shows the cleaning step being carried out using a disc conveyer 50 which conveys elements 2 through a housing 52 in which both sides of the elements 2 are cleaned and dried. It is in these operations that the elements may become skewed. The dried elements are conveyed by the disc conveyer 50 exiting the housing 52 to conveyer 40 for alignment. In this preferred process, no manual handling is required from the start of cleaning to the completion of lamination, high productivity is realizable (high speed and reduced defects) and film waste is minimized.

The lamination process of the present invention can be carried out on any thermoplastic polymeric film and element to which the film will adhere under heat and pressure. The element is generally planar but may include raised portions and incised portions such as depressions and holes. The process is especially useful for laminating such a film which is photosensitive, to an element which is a printed circuit board. The laminated film then serves as a resist for etching or deposition of metal to form a printed circuit according to the process described in U.S. Pat. No. 3,469,982. In such a resist process, the film is exposed to actinic-light to form an image in the film, the image having a different solubility characteristic than the remaining portion of the film. The most soluble portion of the film is then dissolved away by solvent (aqueous or organic or mixture thereof) treatment to leave a resist image on the face of the circuit board. The thus-exposed face of the circuit board can then be treated by etching or deposition of metal to form the printed circuit. In this resist utility, the process of the present invention has to satisfy the critical requirements of (a) achieving sufficient adhesion between the film and the circuit board to withstand the solvent treatment and etching or metal deposition steps so that the printed circuit is faithfully reproduced in the face of the circuit board and (b) retaining the original thickness uniformity of film 22 supplied to the lamination step. Even a small defect in the resist image can mean electrical failure of the printed circuit.

The preferred photosensitive film is one that is made of a photopolymerizable composition, examples of which are disclosed in U.S. Pat. Nos. 3,469,982, 3,218,167, 3,622,334, 3,479,185, and 3,784,557.

An example of specific conditions for operation of one embodiment of the process of the present invention is as follows:

A succession of circuit boards each measuring 46×61 cm and 1.5 mm thick and consisting of a sheet of glass-fiber reinforced epoxy resin sandwiched between two layers of copper each 0.02 mm thick, is placed one-by-one on disc conveyer 50 which operates at a speed of 180 cm/min., to convey the elements through a housing 52 in which each circuit board is scrubbed with abrasive compound, rinsed with water, and then hot air dried. The disc conveyer 50 then successively delivers these clean circuit boards to a conveyer (corresponding to conveyer 40) consisting of two spaced plastic chain-link belts riding in tracks in a table. During conveying by these belts, the circuit boards are aligned with the edges of 46 cm wide film to be laminated to both sides of the circuit board downstream.

The aligned circuit boards are next vacuum cleaned by drawing about 0.2 m³/sec. of air across each face of each circuit board and through slots 49 of vacuum chamber 46. At the same time, each face of each circuit board is subjected to an AC corona discharge of an applied voltage of 7,000 volts into order to neutralize any electrical charges present in the copper faces of the circuit board. Rolls 44 operate at a surface speed of 180 cm/min. to successively convey the circuit boards through this operation.

The circuit boards are next successively gripped and advanced by rubber-covered rolls 14 which are heated by an internal electric heating element in each roll to a temperature of 110° C. The rolls advance the circuit boards at a speed of 180 cm/min.

The rubber-covered laminating rolls 18 are heated to 105° C. in the same manner as rolls 14 and operate at a surface speed of 230 cm/min. to successively pull each circuit board through the last two sets of heated rolls 14 and laminate photosensitive film 46 cm wide to both faces of each circuit board. The pressure of lamination is provided by a pneumatic cylinder exerting 2.5 kg of force on each end of the movable shaft of the upper cylinder 18 towards the fixed shaft of the lower roll 18. The rubber cover on the rolls 18 (and rolls 14) is aluminum powder-filled silicone rubber which makes a contact of about 6 mm wide on the copper faces. The time delays of sensor 26 are set so that the spacing between laminates is 18 mm.

The photosensitive film is a laminate of a layer of photopolymerizable composition 0.038 mm thick on a 0.025 mm thick oriented polyethylene terephthalate support film. The layer of photopolymerizable composition faces the circuit board, so that it is this layer that is laminated to each face of the circuit board. There is no appreciable change in the thickness of the photosensitive layer in the lamination step and the layer adheres well enough to the copper faces that it can be used as a resist. The photosensitive film is supplied to nip 20 by way of guide rolls 24 which maintain the film out of contact with the rolls 18 until the film reaches the nip. This minimizes the length of film that is overheated between laminations and this overheated film is the film that interconnects the resultant laminates together. No trimming of the film from the side edges of the circuit boards is necessary.

As many widely different embodiments of this invention may be made without departing from the spirit and scope thereof, it is to be understood that this invention is not limited to the specific embodiments thereof except as defined in the appended claims.

What is claimed is:

1. A process for laminating a thermoplastic polymeric film to each element in a succession of elements, by which the amount of interconnecting film between the laminated elements is uniformly small, comprising the sequential steps of
    (a) gripping the leading element of the succession of elements between continuously moving surfaces, at least one of which is heated, to preheat at least one face the element and continuously advancing the element to a nip formed between converging surfaces, at least one of which is heated,
    (b) supplying a continuous length of polymeric film to the upstream side of the nip without contact with the converging surfaces and advancing the film through the nip in response to movement of the converging surfaces of the nip, within which the film is heated by contact with a heated converging surface,
    (c) in response to advancement of the preheated element a fixed distance immediately upstream of the nip, initiating movement of the converging surfaces to grip and advance the preheated element through the nip with pressure contact between the heated film and the heated face by which the polymeric film is laminated to the element, the linear speed of the element and film passing through the nip being higher than the linear speed of advancement of the element to the nip,
    (d) discontinuing the movement of the converging surfaces in response to passage of the element a fixed distance immediately downstream of the nip, and
    (e) repeating steps (a) through (d) for remaining elements in the succession of elements.

2. The process of claim 1 in which opposing surfaces of the continuously moving surfaces and of the converging surfaces are heated and polymeric film is supplied to both converging surfaces by which both faces of each element are laminated with polymeric film.

3. The process of claim 1 wherein the polymeric film is photosensitive.

4. The process of claim 1, in which the polymeric film is a photopolymerizable composition.

5. The process of claim 1, in which the elements are printed circuit boards.

6. The process of claim 1, in which the elements of the succession are each aligned prior to step (a), the alignment being retained by the gripping of the elements in step (a).

7. The process of claim 6, in which the alignment of the elements is done by conveying the elements along a path and contacting the side edges of the elements the surfaces which move into and along the path of said conveying.

8. The process of claim 6, in which the elements of the succession are cleaned prior to alignment.

9. The process of claim 6, in which the surfaces of the aligned element are vacuum cleaned prior to being preheated.

* * * * *